(12) United States Patent
Yamashita et al.

(10) Patent No.: US 9,443,793 B2
(45) Date of Patent: Sep. 13, 2016

(54) SEMICONDUCTOR DEVICE (71) Applicant: Panasonic Corporation, Osaka (JP)

(72) Inventors: Hiroki Yamashita, Osaka (JP); Takashi Yui, Shiga (JP); Takeshi Kawabata, Osaka (JP); Kiyomi Hagihara, Osaka (JP); Kenji Yokoyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/141,537

(22) Filed: Dec. 27, 2013

(65) Prior Publication Data

US 2014/0103504 A1  Apr. 17, 2014

Related U.S. Application Data (63) Continuation of application No. PCT/JP2012/005426, filed on Aug. 29, 2012.

(30) Foreign Application Priority Data

Jan. 12, 2012 (JP) .................... 2012-004348

(51) Int. Cl.
*H01L 23/13* (2006.01)
*H01L 23/495* (2006.01)
(Continued)

(52) U.S. Cl.
CPC ......... *H01L 23/49541* (2013.01); *H01L 23/13* (2013.01); *H01L 23/5389* (2013.01); *H01L 24/14* (2013.01); *H01L 24/19* (2013.01); *H01L 24/20* (2013.01); *H01L 24/32* (2013.01);
(Continued)

(58) Field of Classification Search
CPC .... H01L 24/73; H01L 13/13; H01L 23/5389

USPC ........................................................ 257/686
See application file for complete search history.

(56) References Cited

U.S. PATENT DOCUMENTS 8,018,043 B2    9/2011  Suh et al.
8,097,490 B1 *  1/2012  Pagaila et al. ............... 438/106
(Continued)

FOREIGN PATENT DOCUMENTS

CN   1427472     7/2003
JP   11-177020   7/1999
(Continued)

OTHER PUBLICATIONS

International Search Report of PCT Application No. PCT/JP2012/005426 dated Oct. 9, 2012.
(Continued)

*Primary Examiner* — Matthew W Such
*Assistant Examiner* — Krista Soderholm
(74) *Attorney, Agent, or Firm* — Panasonic IP Management; Kerry S. Culpepper (57) ABSTRACT

A first chip including electrodes is mounted above an expanded semiconductor chip formed by providing an expanded portion at an outer edge of a second chip including chips. The electrodes of the first chip are electrically connected to the electrodes of the second chip by conductive members. A re-distribution structure is formed from a top of the first chip outside a region for disposing the conductive members along a top of the expanded portion. Connection terminals are provided above the expanded portion, and electrically connected to ones of the electrodes of the first chip via the re-distribution structure.

20 Claims, 8 Drawing Sheets (51) Int. Cl.
*H01L 23/538* (2006.01)
*H01L 25/065* (2006.01)
*H01L 25/18* (2006.01)
*H01L 21/56* (2006.01)
*H01L 23/00* (2006.01)

(52) U.S. Cl.
CPC ............ *H01L24/73* (2013.01); *H01L 24/92* (2013.01); *H01L 25/0657* (2013.01); *H01L 21/563* (2013.01); *H01L 23/49575* (2013.01); *H01L 24/05* (2013.01); *H01L 24/13* (2013.01); *H01L 24/16* (2013.01); *H01L 24/17* (2013.01); *H01L 24/33* (2013.01); *H01L 24/48* (2013.01); *H01L 24/81* (2013.01); *H01L 24/83* (2013.01); *H01L 24/85* (2013.01); *H01L 25/18* (2013.01); *H01L 2224/0401* (2013.01); *H01L 2224/04042* (2013.01); *H01L 2224/04105* (2013.01); *H01L 2224/12105* (2013.01); *H01L 2224/13021* (2013.01); *H01L 2224/13023* (2013.01); *H01L 2224/14136* (2013.01); *H01L 2224/16145* (2013.01); *H01L 2224/16225* (2013.01); *H01L 2224/16227* (2013.01); *H01L 2224/1703* (2013.01); *H01L 2224/2101* (2013.01); *H01L 2224/211* (2013.01); *H01L 2224/215* (2013.01); *H01L 2224/26145* (2013.01); *H01L 2224/32013* (2013.01); *H01L 2224/32058* (2013.01); *H01L 2224/32059* (2013.01); *H01L 2224/32145* (2013.01); *H01L 2224/32225* (2013.01); *H01L 2224/32245* (2013.01); *H01L 2224/3312* (2013.01); *H01L 2224/48091* (2013.01); *H01L 2224/48105* (2013.01); *H01L 2224/48227* (2013.01); *H01L 2224/48247* (2013.01); *H01L 2224/48463* (2013.01); *H01L 2224/48465* (2013.01); *H01L 2224/73204* (2013.01); *H01L 2224/73207* (2013.01); *H01L 2224/73209* (2013.01); *H01L 2224/73253* (2013.01); *H01L 2224/73265* (2013.01); *H01L 2224/73267* (2013.01); *H01L 2224/81193* (2013.01); *H01L 2224/82101* (2013.01); *H01L 2224/82106* (2013.01); *H01L 2224/83104* (2013.01); *H01L 2224/85* (2013.01); *H01L 2224/92* (2013.01); *H01L 2224/92127* (2013.01); *H01L 2224/92225* (2013.01); *H01L 2224/92247* (2013.01); *H01L 2225/0651* (2013.01); *H01L 2225/0652* (2013.01); *H01L 2225/06513* (2013.01); *H01L 2924/15311* (2013.01); *H01L 2924/18162* (2013.01); *H01L 2924/30107* (2013.01); *H01L 2924/381* (2013.01)

(56) References Cited

U.S. PATENT DOCUMENTS

| 2003/0116867 | A1 | 6/2003 | Nakamura et al. | |
|---|---|---|---|---|
| 2004/0089464 | A1 | 5/2004 | Yamada | |
| 2004/0217485 | A1 | 11/2004 | Chung | |
| 2006/0138671 | A1* | 6/2006 | Watanabe | 257/773 |
| 2006/0163728 | A1 | 7/2006 | Nakanishi et al. | |
| 2008/0237883 | A1 | 10/2008 | Tago et al. | |
| 2010/0246144 | A1 | 9/2010 | Yamazaki et al. | |
| 2011/0089573 | A1 | 4/2011 | Kurita | |
| 2011/0241194 | A1* | 10/2011 | Chen et al. | 257/686 |

FOREIGN PATENT DOCUMENTS

| JP | 2000-124354 | 4/2000 |
|---|---|---|
| JP | 2004-165189 | 6/2004 |
| JP | 2006-203079 | 8/2006 |
| JP | 2008-251912 | 10/2008 |
| JP | 2009-16557 | 1/2009 |
| JP | 2010-141080 | 6/2010 |
| WO | 2007/086481 | 8/2007 |
| WO | 2010/058646 | 5/2010 |

OTHER PUBLICATIONS

English Translation of Chinese Search Report dated Jun. 1, 2016 for the related Chinese Patent Application No. 201280029271.9.

* cited by examiner

SEMICONDUCTOR DEVICE

CROSS-REFERENCE TO RELATED APPLICATIONS

This is a continuation of International Application No. PCT/JP2012/005426 filed on Aug. 29, 2012, which claims priority to Japanese Patent Application No. 2012-004348 filed on Jan. 12, 2012. The entire disclosures of these applications are incorporated by reference herein.

BACKGROUND

The present disclosure relates to semiconductor devices, and more particularly to semiconductor devices formed by stacking chips by a chip-on-chip technique.

In systems such as digital televisions and recorders, the amount of handled data is dramatically increasing with an increase in the number of functions. This increases the capacity of semiconductor memories mounted in the systems. Not only that, semiconductor memories performing high-rate data transfer have been increasingly demanded. In addition, in order to mount a large number of semiconductor memories in a system, semiconductor devices including a memory controller for integrating semiconductor logic circuits and the memories are being developed.

To integrate a logic circuit and a memory, there are a system-on-chip (SoC) formed by integrating a logic circuit and a memory in a single chip, and a system-in-package (SiP) formed by stacking and storing a logic circuit chip and a memory chip in a single package. Out of them, the SiP is well-balanced to meet the demand for lower costs, higher function, lower power consumption, miniaturization, a lower weight, flexible specifications, etc., which are required for a system. Although it depends on the system configuration and the specification, SiPs are increasingly advantageous in general.

SiPs are divided into four types of a chip-on-chip (CoC) type, a chip-stack type, a package-on-package type, and a substrate connection type based on the structural differences. Out of them, the CoC type SiP is formed by stacking a chip on a semiconductor chip, and connecting the circuit formation surfaces of the chips (see, e.g., Japanese Unexamined Patent Publication No. 2010-141080). These two (i.e., upper and lower) chips include a number of bumps for connection on their circuit surfaces. These bumps are generally much smaller than bumps for flip-chip bonding and called "microbumps." In CoC type SiPs, a most suitable design or fabrication process of the upper and lower chips can be selected, thereby increasing the flexibility in selecting the system structure.

In CoC type SiPs, in bonding the upper and lower chips with microbumps, the location of chip electrodes are optimized depending on the locations of the CoC connecting portions (i.e., microbumps). Therefore, in general, at least one of the upper and lower chips has a structure of re-distribution from the chip electrodes to the CoC connecting portions.

SUMMARY

However, the CoC technique shown in Japanese Unexamined Patent Publication No. 2010-141080 is based on the assumption that a chip mounted in a higher position is smaller than a chip mounted in a lower position. In the CoC technique shown in Japanese Unexamined Patent Publication No. 2010-141080, if a chip to be mounted in a lower position is smaller than an upper chip, conductive members cannot be physically drawn from connection terminals, which are provided above the lower chip for electrical connection with a mounting substrate, by simple connection such as wire bonding due to performance constraints, etc.

In the CoC technique shown in Japanese Unexamined Patent Publication No. 2010-141080, the periphery of microbumps (i.e., CoC connecting portions) of the lower chip and the periphery of other connecting portions such as wire bonding portions are entirely covered by resist. With this configuration, in addition to the accuracy in the width and the space of the connecting portions, the accuracy in exposure of the resist opening itself becomes constraints on performing re-distribution corresponding to reduction in the pitch of the CoC connecting portions, which have been formed in advance. In particular, if the lower chip has a higher-density interconnect than the upper chip, and needs to be subjected to fine re-distribution, the fine re-distribution of the connecting portions of the lower chip and the periphery becomes difficult due to the above-described reasons, thereby hindering the formation of the CoC structure.

In view of the foregoing, it is an objective of the present disclosure to provide a CoC type SiP corresponding to the cases where a lower chip is smaller than an upper chip, and where the pitch of CoC connecting portions is reduced.

In order to achieve the objective, the present inventors found forming an expanded semiconductor chip by providing an expanded portion around the outer edge of a lower chip in mounting a CoC type SiP, and forming a re-distribution structure on the expanded portion and the lower chip outside the region of disposing conductive members, which electrically connect the upper chip to the lower chip, to electrically connect the upper chip to the lower chip without interposing the re-distribution structure.

Specifically, a semiconductor device according to an aspect of the present disclosure includes a base including first electrodes; a first semiconductor chip located on a surface of the base provided with the first electrodes, and including second electrodes; an expanded portion expanding outward from an outer edge of the first semiconductor chip, and forming an expanded semiconductor chip together with the first semiconductor chip; a second semiconductor chip including third electrodes, and located on the expanded semiconductor chip such that a surface of the second semiconductor chip provided with the third electrodes faces a surface of the first semiconductor chip provided with the second electrodes; first conductive members connecting the second electrodes to the third electrodes; a re-distribution structure formed from a top of the first semiconductor chip outside a region for disposing the first conductive members along a top of the expanded portion; connection terminals provided above the expanded portion, and connected to ones of the second electrodes, which are connected to none of the first conductive members via the re-distribution structure; and second conductive members connecting the first electrodes to the connection terminals.

In the semiconductor device according to the present disclosure, the re-distribution structure may be located to avoid at least the region for disposing the first conductive members, thereby forming an opening in the re-distribution structure in the region for disposing the first conductive members. In this case, a center of the opening of the re-distribution structure may not be identical with a center of the region for disposing the first conductive members. The opening of the re-distribution structure may reach one side of an outer periphery of the expanded semiconductor chip, two sides of an outer periphery of the expanded semiconductor chip, three sides of an outer periphery of the expanded semiconductor chip, or four sides of an outer periphery of the expanded semiconductor chip. The opening of the re-distribution structure may reach an outside of one side of an outer periphery of the second semiconductor chip, outsides of two sides of an outer periphery of the second semiconductor chip, outsides of three sides of an outer periphery of the second semiconductor chip, or outsides of four sides of an outer periphery of the second semiconductor chip.

In the semiconductor device according to the present disclosure, the first conductive members may be bumps.

In the semiconductor device according to the present disclosure, the connection terminals may be wire-bonding terminals, and the second conductive members may be wires.

In the semiconductor device according to the present disclosure, the re-distribution structure may include re-distribution lines connecting the first electrodes to the connection terminals, and an interlayer film covering the re-distribution lines. In this case, the interlayer film may be made of a resin material covering the expanded semiconductor chip. The resin material may be a photosensitive resin material, and resolution of the photosensitive resin material may be lower than resolution of other photosensitive resin materials used for the second semiconductor chip. At least an upper portion of the interlayer film may be made of solder resist.

In the semiconductor device according to the present disclosure, the thickness of the re-distribution structure is substantially equal to or smaller than a bonding gap between the expanded semiconductor chip and the second semiconductor chip.

In the semiconductor device according to the present disclosure, a width and a pitch of the re-distribution lines are greater than those of other lines formed in the second semiconductor chip.

In the semiconductor device according to the present disclosure, a planar shape of the second semiconductor chip may be larger than a planar shape of the first semiconductor chip. A planar shape of the expanded semiconductor chip may be larger than the planar shape of the second semiconductor chip.

A semiconductor device according to another aspect of the present disclosure includes a first semiconductor chip including first electrodes; an expanded portion expanding outward from an outer edge of the first semiconductor chip, and forming an expanded semiconductor chip together with the first semiconductor chip; a second semiconductor chip including second electrodes, and located on the expanded semiconductor chip such that a surface of the second semiconductor chip provided with the second electrodes faces a surface of the first semiconductor chip provided with the first electrodes; conductive members connecting the first electrodes to the second electrodes; a re-distribution structure formed from a top of the first semiconductor chip outside a region for disposing the conductive members along a top of the expanded portion; and connection terminals provided above the expanded portion, and connected to ones of the first electrodes, which are connected to none of the conductive members, via the re-distribution structure.

The present disclosure provides a CoC-type SiP corresponding to the case where a lower chip is smaller than an upper chip, and the pitch of CoC connecting portions is reduced.

DETAILED DESCRIPTION

The semiconductor device according to the present disclosure has the structure described in the above "SUMMARY" as a base with various aspects described below.

Embodiment

Figure 1:
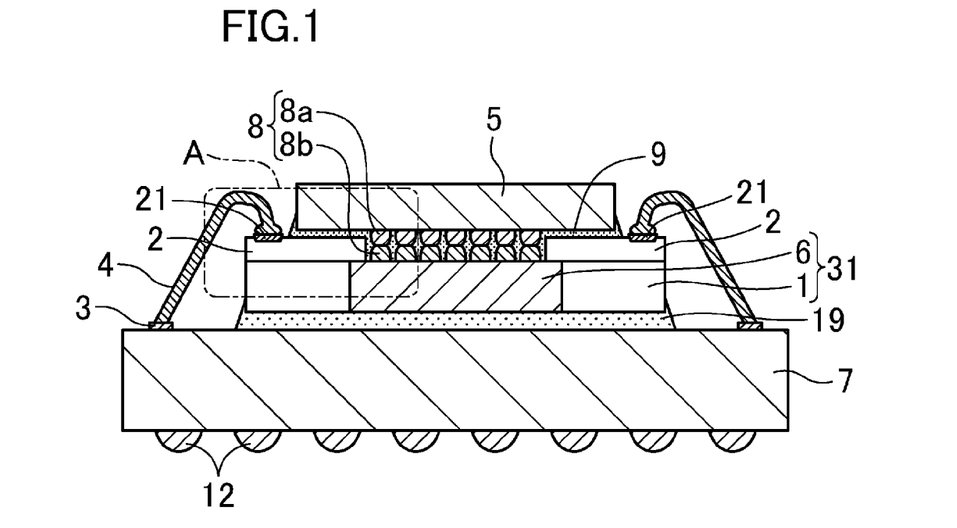
FIG. 1 is a cross-sectional view illustrating a semiconductor device according to an embodiment.
Figure 2:
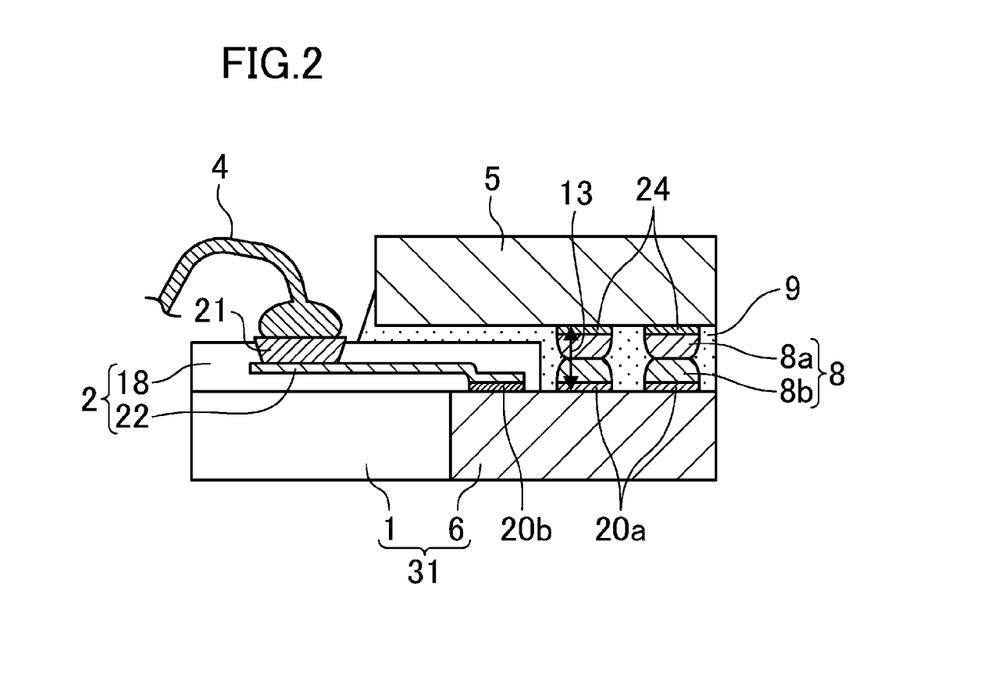
FIG. 2 is a cross-sectional view illustrating an enlarged region A of FIG. 1.

FIG. 1 illustrates the cross-sectional structure of a semiconductor device according to an embodiment. FIG. 2 illustrates an enlarged region A of FIG. 1.

As shown in FIGS. 1 and 2, an expanded portion 1 made of, for example, resin is provided to expand outward from the outer edge of a chip 6, which is, for example, a logic circuit chip. The chip 6 and the expanded portion 1 form an expanded semiconductor chip 31. A plurality of electrodes 20a electrically connected to various elements (not shown) inside the chip 6, and a plurality of electrodes 20b electrically connected to the plurality of electrodes 20a via internal interconnects (not shown) of the chip 6 are formed on the top of the chip 6. A chip 5, which includes a plurality of electrodes 24, and is, for example, a memory chip, is mounted above the expanded semiconductor chip 31. The chip 5 is stacked above the expanded semiconductor chip 31 such that the surface of the chip 6 provided the electrodes 20a faces the surface of the chip 5 provided the electrodes 24. Bumps 8a are formed on the electrodes 24 of the chip 5, while bumps 8b are formed on the electrodes 20a of the chip 6. The bumps 8a are connected to the bumps 8b, thereby electrically connecting the electrodes 24 to the electrodes 20a. In other words, the electrodes 24 are electrically connected to the electrodes 20a via the conductive members (i.e., CoC connecting portions) 8 formed by the bumps 8a and the bumps 8b. The plurality of electrodes 24 of the chip 5 may include electrodes not electrically connected to the electrodes 20a of the chip 6. On the other hand, the plurality of electrodes 20a of the chip 6 exist in the region for disposing the conductive members (i.e., the CoC connecting portions) 8.

As shown in FIGS. 1 and 2, a plurality of connection terminals 21 are formed above the expanded portion 1 via a re-distribution structure 2 formed by re-distribution lines 22 and a re-distribution line interlayer film 18 covering the re-distribution lines 22. The plurality of connection terminals 21 are electrically connected to the plurality of electrodes 20b provided on the chip 6 via the re-distribution structure 2 (specifically, the re-distribution lines 22). The re-distribution line interlayer film 18 may be made of an insulating resin material.

FIG. 2 shows that the electrodes 20a and 20b of the chip 6 are exposed on the wafer surface. This is for simplification of the figure. In practice, a usual wafer fabrication process may be employed, which forms a surface protective film to cover the uppermost layer of the wafer. Specifically, in the structure shown in FIG. 2, a surface protective film (not shown) may be formed, which covers the surface of the chip 6 including the portion under the re-distribution structure 2 and exposes the portions for forming the electrodes 20a and 20b.

Figure 3:
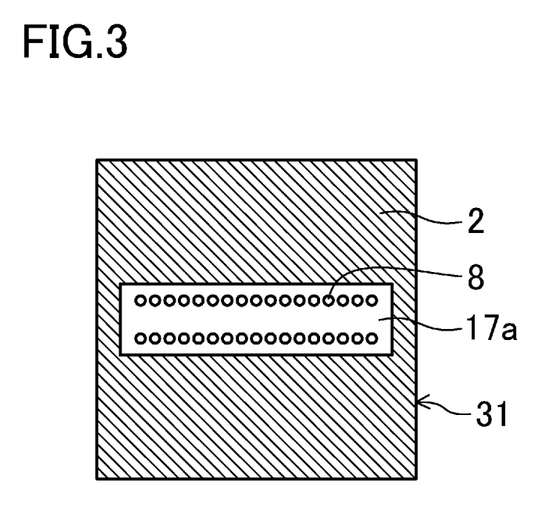
FIG. 3 is a top view schematically illustrating an opening of a re-distribution structure 2 of the semiconductor device according to the embodiment.

One of features of this embodiment, the re-distribution structure 2 is formed from the top of the chip 6 outside the region for disposing the conductive members 8 (i.e., the region for disposing the electrodes 20a) along the top of the expanded portion 1. The re-distribution structure 2 may be located to avoid the region for disposing the conductive members 8. As a result, for example, as shown in FIG. 3, the re-distribution structure 2 may have an opening 17a in the region for disposing the conductive members 8. FIG. 3 is a top view schematically illustrating the opening of the re-distribution structure 2. In FIG. 3, the same reference characters as those shown in FIGS. 1 and 2 are used to represent equivalent elements.

With the above-described positioning of the re-distribution structure 2, the expanded semiconductor chip 31 (specifically, the lower chip 6 being, for example, a logic circuit chip) and the upper chip 5 being, for example, a memory chip, are electrically connected together by the conductive members 8 without interposing the re-distribution structure 2.

While in this embodiment, the bumps 8a and 8b are formed as the conductive members 8, the conductive members 8 are clearly not limited thereto. Wire bonding pads may be formed as the connection terminals 21. Where the bumps 8a and 8b are formed as the conductive members 8, and the wire bonding pads are formed as the connection terminals 21, they are easily formed by an existing manufacturing technique.

In this embodiment, the planar size of the chip 5 is greater than the planar size of the chip 6. The expanded portion 1 is formed in the periphery of the chip 6 so that the planar size of the expanded semiconductor chip 31 is greater than the planar size of the chip 5. Therefore, each side of the expanded semiconductor chip 31 is longer than each side of the chip 5.

In this embodiment, as shown in FIG. 1, an underfill 9 may be injected between the chip 5 and the expanded semiconductor chip 31 to fix the connecting portion between the chip 5 and the expanded semiconductor chip 31.

In this embodiment, as shown in FIG. 1, the stacked chips of the chip 5 and the expanded semiconductor chip 31 may be fixed on the top of a resin substrate 7 with a dice bond 19. Package balls 12 are formed on the bottom of the resin substrate 7. This electrically connects the semiconductor device to an external device. A plurality of electrode pads 3 may be formed on the top of the resin substrate 7 outside the region for mounting the stacked chips of the chip 5 and the expanded semiconductor chip 31. The plurality of electrode pads 3 on the top of the resin substrate 7 may be electrically connected to the plurality of connection terminals 21 above the expanded portion 1 by wires 4.

In this embodiment, the pitch of arranging the conductive members 8 (i.e., the bumps 8a and 8b), which connect the expanded semiconductor chip 31 (i.e., the chip 6) to the chip 5, may be smaller than the pitch of arranging the connection terminals 21 above the expanded portion 1. The pitch of arranging the connection terminals 21 above the expanded portion 1 may be smaller than the pitch of arranging the package balls 12 which are external terminals of the semiconductor device.

Specifically, the pitch of arranging of the conductive members 8 (i.e., the bumps 8a and 8b) may range, for example, from about 20 μm to about 50 μm to cope with an increase in the number of pins with an increase in the bandwidth and the operation speed of the chip 5, which is a memory chip. The pitch of arranging the connection terminals 21 above the expanded portion 1 may range, for example, from about 40 μm to about 200 μm. The pitch of arranging the package balls 12 being external terminals of the semiconductor device may range, for example, from 400 μm to 1000 μm.

In this embodiment, the width, the distance, and the pitch of the re-distribution lines 22 may be greater than those of lines (not shown) formed in the chip 5 or the chip 6. This structure requires no particular fine process for forming the re-distribution lines 22, thereby simplifying steps and enabling manufacture at low costs. By increasing the width of the re-distribution lines 22, the inductance can be electrically reduced, thereby strengthening the power source and ground to reduce interconnection noise.

In this embodiment, although not shown in the figure, the stacked chips of the chip 5 and the expanded semiconductor chip 31 are enclosed with resin, thereby forming a CoC stacked semiconductor package. Instead of the resin substrate 7, for example, a lead frame, etc., may be the base for mounting the stacked chips of the chip 5 and the expanded semiconductor chip 31.

According to this above-described embodiment, in the semiconductor package having the CoC structure, the expanded portion 1 is provided around the outer edge of the lower chip 6 to form the expanded semiconductor chip 31. Thus, even if the lower chip 6 is smaller than the upper chip 5, the expanded semiconductor chip 31 can be greater than the upper chip 5. The expanded semiconductor chip 31 is subjected to re-distribution processing, thereby obtaining a connection terminal region for external electrical connection. Specifically, the conductive members (e.g., the wires 4) can be drawn from the connection terminals 21, which are provided above the expanded portion 1 of the expanded semiconductor chip 31 for the electrical connection with the resin substrate 7, without using a particular semiconductor process. That is, the conductive members are drawn using simple connection such as wire bonding. Therefore, the chips 5 and 6 can be stacked to form the semiconductor package having the CoC structure without being influenced by constraints of the magnitude relation between the sizes of the stacked chips 5 and 6.

According to this embodiment, in the semiconductor package having the CoC structure, the re-distribution structure 2 is provided on the top of the expanded portion 1 and on the top of the lower chip 6 outside the region for disposing the conductive members (i.e., the CoC connecting portions) 8, which electrically connect the upper chip 5 to the lower chip 6. Thus, the chips 5 and 6 can be electrically connected together without interposing the re-distribution structure 2. Even when the pitch of the conductive members (i.e., the CoC connecting portions) 8 is reduced, there is no need to miniaturize the re-distribution structure 2 accordingly. Therefore, a miniaturized bonding structure is formed between the expanded semiconductor chip 31 and the chip 5 by a fine process without being influenced by constraints of the process rule of re-distribution, for example, without constraints of accuracy in exposure, etc., in providing an opening in the insulating resin material on the re-distribution lines 22. As a result, the semiconductor package having the CoC structure can be formed, while reducing the areas of the chips.

In this embodiment, the electrodes 20a and the electrodes 20b on the chip 6 are electrically connected via internal interconnects of the chip 6. This reduces influence of underfill, moisture, etc., on the electrical connection between the electrodes 20a and the electrodes 20b, thereby reducing leakage currents and providing high reliability.

While in FIG. 2, the re-distribution structure 2 is formed by providing the single layer of the re-distribution lines 22, the re-distribution structure 2 may include a plurality of re-distribution lines 22. By providing two or more layers of the re-distribution lines 22, the interconnection density increases, thereby forming a high-density CoC structure.

In this embodiment, the re-distribution line interlayer film 18 covering the re-distribution lines 22 is made of the insulating resin material. At least the portion of the re-distribution structure 2 located higher than the re-distribution lines 22 needs to be made of an insulating resin material such as solder resist or polyimide.

Where there is no need to provide a fine interconnect above the expanded portion 1, manufacturing at low costs is possible by using solder resist as the insulating resin material covering the re-distribution lines 22. Specifically, where the pitch of wire bonding portions may be greater than the pitch of the CoC connecting portions (the conductive materials 8), the re-distribution structure 2 on the top of the expanded portion 1 including the wire bonding portions may be made of a photosensitive insulating material such as solder resist, having low resolution. In other words, the resolution of the photosensitive insulating material serving as the re-distribution line interlayer film 18 covering the re-distribution lines 22 may be lower than the resolution of the photosensitive resin material used for the chip 5. As a result, miniaturization at low costs is possible.

On the other hand, where there is a need to provide a fine interconnect above the expanded portion 1, the insulating resin material covering the re-distribution lines 22 may be a resin material such as polyimide, etc.

In this embodiment, a bonding gap 13 shown in FIG. 2 between the expanded semiconductor chip 31 (i.e., the chip 6) and the chip 5 is greater or smaller than the thickness of the re-distribution structure 2. Where the bonding gap 13 and the thickness of the re-distribution structure 2 are almost equal, the height of the bonding gap 13 is easily controlled using the thickness of the re-distribution structure 2. Where the thickness of the re-distribution structure 2 is almost equal to or smaller than the bonding gap 13 between the expanded semiconductor chip 31 and the chip 5, the chip 5 is easily mounted on the expanded semiconductor chip 31.

In this embodiment, the connection terminals (i.e., wire bonding pads) 21 above the expanded portion 1 are electrically connected to the electrode pads 3 on the resin substrate 7 by the wires 4. Instead, the connection terminals 21 being conventional electrode terminals are provided above the expanded portion 1 to electrically connect the connection terminals 21 to the electrode pads 3 on the resin substrate 7 via interconnects formed along the sidewalls of the expanded portion 1 or the top of the resin substrate 7.

A method of manufacturing the semiconductor device according to the embodiment will be described hereinafter with reference to FIGS. 4A-4E, 5A-5E, and 6A-6C. In FIGS. 4A-4E, 5A-5E, and 6A-6C, the same reference characters as those of the semiconductor device according to this embodiment shown in FIGS. 1 and 2 are used to represent equivalent elements.

Figure 4A:
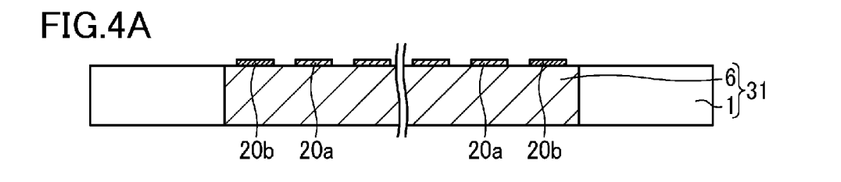
FIGS. 4A-4E are cross-sectional views illustrating steps of a method of manufacturing the semiconductor device according to the embodiment.

First, as shown in FIG. 4A, the expanded portion 1 is formed to expand outward from the outer edge of the chip 6. As a result, the chip 6 and the expanded portion 1 form the expanded semiconductor chip 31. The plurality of electrodes 20a, which are electrically connected to various elements (not shown) in the chip 6, and the plurality of electrodes 20b, which are electrically connected to the plurality of electrodes 20a via internal interconnects (not shown) of the chip 6, are formed on the top of the chip 6.

Figure 4B:
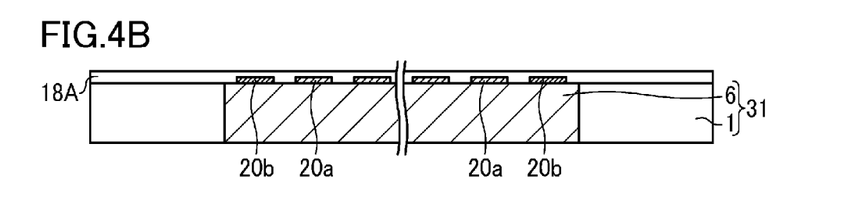

Next, as shown in FIG. 4B, an insulating resin layer 18A is formed on the expanded semiconductor chip 31 to cover the electrodes 20a and 20b.

Figure 4C:
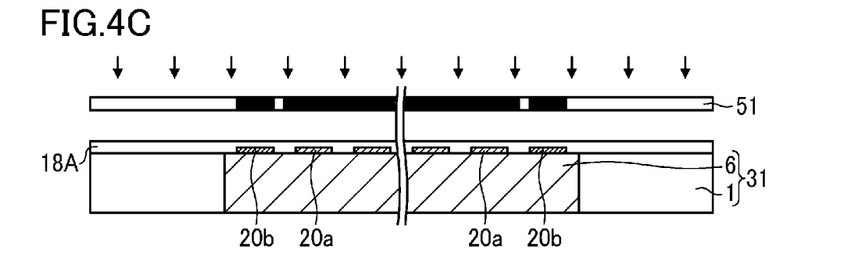
Figure 4D:
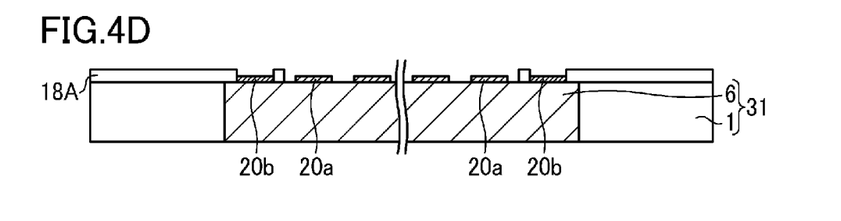

Then, as shown in FIG. 4C, exposure is performed using a mask 51, in which the regions for forming the electrodes 20b and the CoC connecting portions are open. After that, as shown in FIG. 4D, a photosensitive region of the insulating resin layer 18A is selectively removed.

Figure 4E:
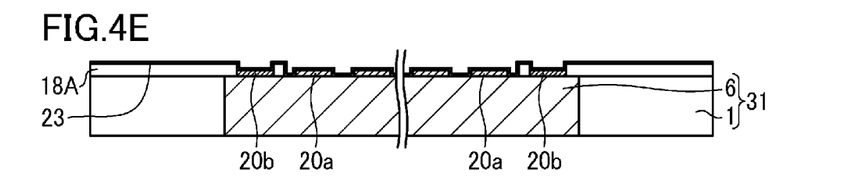
Figure 5A:
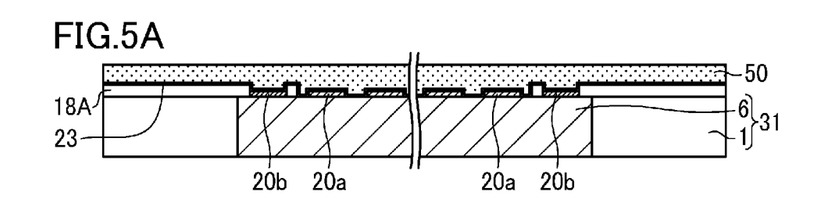
FIGS. 5A-5E are cross-sectional views illustrating steps of the method of manufacturing the semiconductor device according to the embodiment.

Next, as shown in FIG. 4E, a re-distribution seed layer 23 is formed on the expanded semiconductor chip 31 including the residual portions of the tops of the insulating resin layer 18A. Then, as shown in FIG. 5A, resist 50 is applied onto the re-distribution seed layer 23.

Figure 5B:
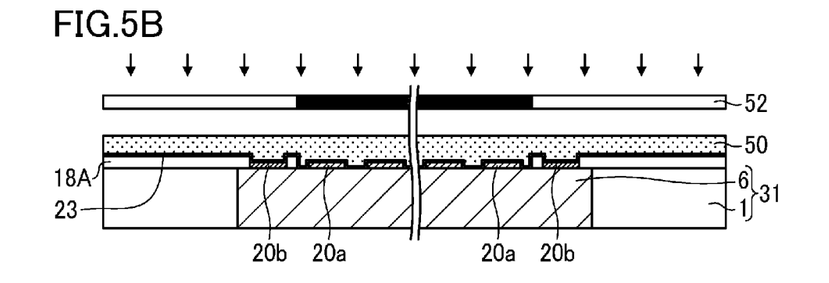
Figure 5C:
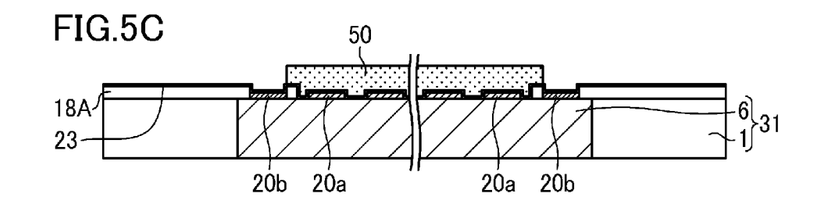

Then, as shown in FIG. 5B, exposure is performed using a mask 52, in which the region for forming the CoC connecting portions is open. After that, as shown in FIG. 5C, a non-photosensitive region of the resist 50 is selectively removed.

Figure 5D:
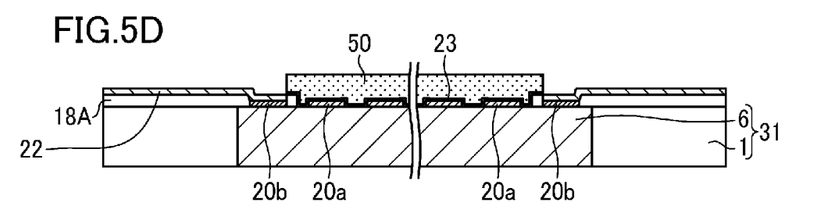
Figure 5E:
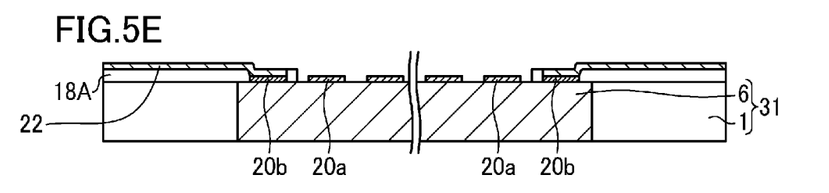

After that, as shown in FIG. 5D, plating growth is performed on the re-distribution seed layer 23 with the region for forming the CoC connecting portions covered with the residual resist 50, thereby forming the re-distribution lines 22 connected to the electrodes 20b. Then, as shown in FIG. 5E, the resist 50 and the portion of the re-distribution seed layer 23 remaining under the resist 50 are removed.

Figure 6A:
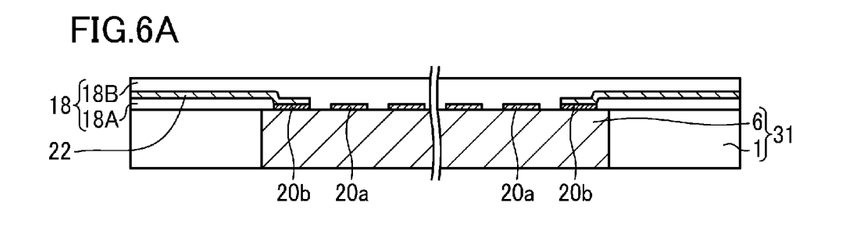
FIGS. 6A-6C are cross-sectional views illustrating steps of the method of manufacturing the semiconductor device according to the embodiment.

Next, as shown in FIG. 6A, an insulating resin layer 18B is formed on the entire surface of the expanded semiconductor chip 31 including the tops of the re-distribution lines 22. The insulating resin layer 18B is photosensitive.

Figure 6B:
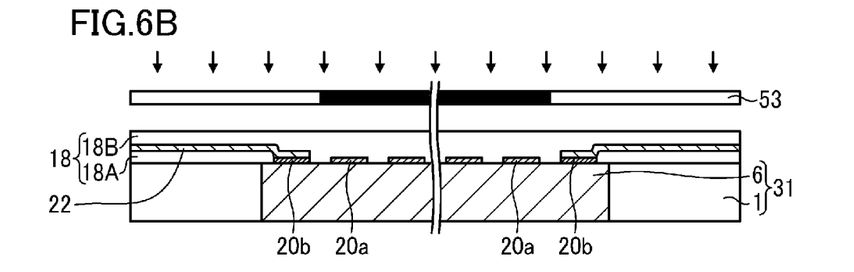
Figure 6C:
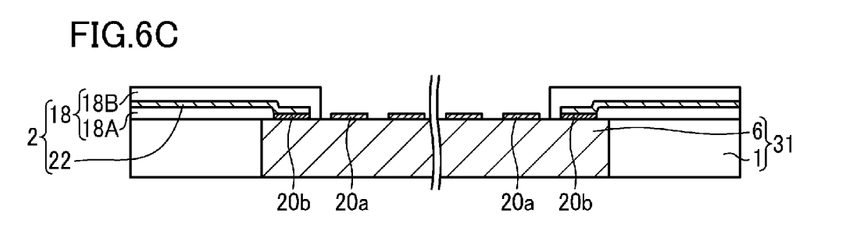

Then, as shown in FIG. 6B, exposure is performed using a mask 53, in which the region for forming the CoC connecting portions is open. After that, as shown in FIG. 6C, the photosensitive region of the insulating resin layer 18B is selectively removed. As a result, the re-distribution lines 22 and the insulating resin layers 18A and 18B (hereinafter referred to as the re-distribution line interlayer film 18) covering the re-distribution lines 22 form the re-distribution structure 2. The re-distribution structure 2 has an opening in the region for forming the CoC connecting portions.

After that, although not shown in the figure, after bumps are formed on the electrodes 20a of the chip 6, the chip 5 is mounted on the expanded semiconductor chip 31, and the chips 5 and 31 are bonded by CoC bonding. Then, the stacked structure of the expanded semiconductor chip 31 and the chip 5 is bonded onto a substrate by dice bonding. The substrate is electrically connected to the expanded semiconductor chip 31 by wire bonding. After that, molding is performed, thereby obtaining a desired CoC package.

First Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the center of the opening 17a of the re-distribution structure 2 is substantially identical with the center of the region for disposing the conductive members 8 as shown in FIG. 3.

Figure 7A:
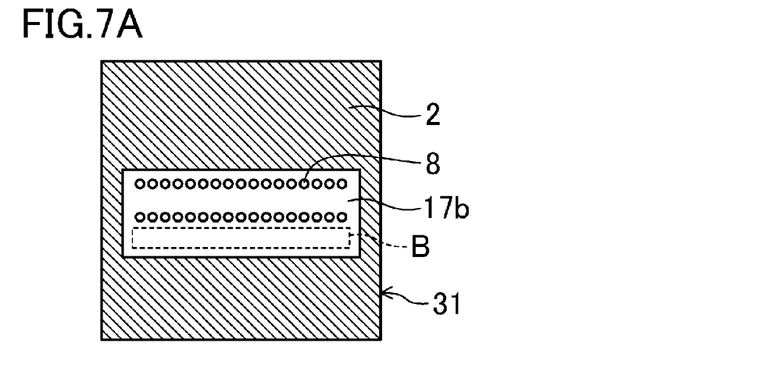
FIGS. 7A-7E are top views schematically illustrating the opening of a re-distribution structure 2 of the semiconductor device according to variations.

On the other hand, in this variation, as shown in FIG. 7A, the re-distribution structure 2 has the opening 17b in the region for disposing the conductive members 8. The center of the opening 17b is not identical with the center of the region for disposing the conductive members 8. Specifically, the opening 17b of the re-distribution structure 2 according to this variation is formed in the region for disposing the conductive members 8 and a region B adjacent to the region. FIG. 7A is a top view schematically illustrating the opening of the re-distribution structure 2 according to this variation. In FIG. 7A, the same reference characters as those of the semiconductor device shown in FIGS. 1 and 2 are used to represent equivalent elements.

In addition to the advantages similar to those of the above-described embodiment, the above-described variation provides the following advantages. Specifically, for example, if the underfill material (i.e., the material of the underfill 9 of FIG. 1) is injected from the region B shown in FIG. 7A, leakage of the underfill material is retained in the opening 17b. This reduces the distance from the region for disposing the conductive members 8 to the connection terminals 21 (not shown) above the expanded semiconductor chip 31 (specifically, the expanded portion 1). As such, the area of the expanded semiconductor chip 31 decreases, thereby manufacturing the semiconductor device at low costs.

Second Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the entire periphery of the opening 17a of the re-distribution structure 2 is surrounded by the re-distribution structure 2 as shown in FIG. 3.

Figure 7B:
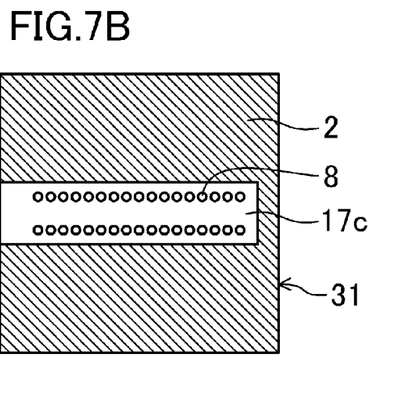

On the other hand, in this variation, as shown in FIG. 7B, the re-distribution structure 2 has an opening 17c in the region for disposing the conductive members 8. The opening 17c reaches one side of the outer periphery of the expanded semiconductor chip 31. FIG. 7B is a top view schematically illustrating the opening of the re-distribution structure 2 according to this variation. In FIG. 7B, the same reference characters as those of the semiconductor device shown in FIGS. 1 and 2 are used to represent equivalent elements.

In addition to the advantages similar to those of the above-described embodiment, the above-described variation provides the following advantages. Specifically, for example, if the underfill material (i.e., the material of the underfill 9 of FIG. 1) is injected from one side of the expanded semiconductor chip 31 reached by the opening 17c of the re-distribution structure 2, the underfill material can be selectively discharged from the one side. There is thus no need to address the leakage of the underfill material at the other three sides of the expanded semiconductor chip 31. In other words, the filling characteristics of the underfill 9 improve, thereby manufacturing the semiconductor device at low costs.

Third Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the entire periphery of the opening 17a of the re-distribution structure 2 is surrounded by the re-distribution structure 2 as shown in FIG. 3.

Figure 7C:
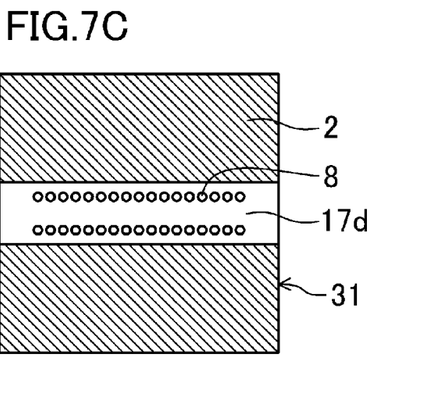

On the other hand, in this variation, as shown in FIG. 7C, the re-distribution structure 2 has an opening 17d in the region for disposing the conductive members 8. The opening 17d reaches two sides of the outer periphery of the expanded semiconductor chip 31. FIG. 7C is a top view schematically illustrating the opening of the re-distribution structure 2 according to this variation. In FIG. 7C, the same reference characters as those of the semiconductor device shown in FIGS. 1 and 2 are used to represent equivalent elements.

In addition to the advantages similar to those of the above-described embodiment, the above-described variation provides the following advantages. Specifically, for example, if the underfill material (i.e., the material of the underfill 9 of FIG. 1) is injected from at least one of the two sides of the expanded semiconductor chip 31 reached by the opening 17d of the re-distribution structure 2, the underfill material can be selectively discharged from the two sides. There is thus no need to address the leakage of the underfill material at the other two sides of the expanded semiconductor chip 31. In other words, the filling characteristics of the underfill 9 improve, thereby manufacturing the semiconductor device at low costs.

In this variation, the underfill material is discharged from the two sides of the expanded semiconductor chip 31 reached by the opening 17d of the re-distribution structure 2. This further reduces the leakage of the underfill material at the other two sides of the expanded semiconductor chip 31 as compared to the above-described second variation.

Fourth Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the entire periphery of the opening 17a of the re-distribution structure 2 is surrounded by the re-distribution structure 2 as shown in FIG. 3.

Figure 7D:
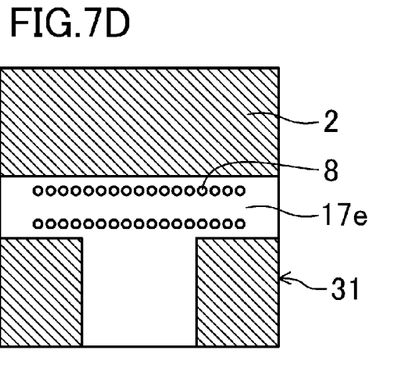

On the other hand, in this variation, as shown in FIG. 7D, the re-distribution structure 2 has an opening 17e in the region for disposing the conductive members 8. The opening 17e reaches three sides of the outer periphery of the expanded semiconductor chip 31. FIG. 7D is a top view schematically illustrating the opening of the re-distribution structure 2 according to this variation. In FIG. 7D, the same reference characters as those of the semiconductor device shown in FIGS. 1 and 2 are used to represent equivalent elements.

In addition to the advantages similar to those of the above-described embodiment, the above-described variation provides the following advantages. Specifically, for example, if the underfill material (i.e., the material of the underfill 9 of FIG. 1) is injected from at least one of the three sides of the expanded semiconductor chip 31 reached by the opening 17e of the re-distribution structure 2, the underfill material can be selectively discharged from the three sides.

There is thus no need to address the leakage of the underfill material at the other one side of the expanded semiconductor chip 31. In other words, the filling characteristics of the underfill 9 improve, thereby manufacturing the semiconductor device at low costs.

In this variation, the underfill material is discharged from the three sides of the expanded semiconductor chip 31 reached by the opening 17d of the re-distribution structure 2. This further reduces the leakage of the underfill material at the other one side of the expanded semiconductor chip 31 as compared to the above-described second and third variations.

Fifth Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the entire periphery of the opening 17a of the re-distribution structure 2 is surrounded by the re-distribution structure 2 as shown in FIG. 3.

Figure 7E:
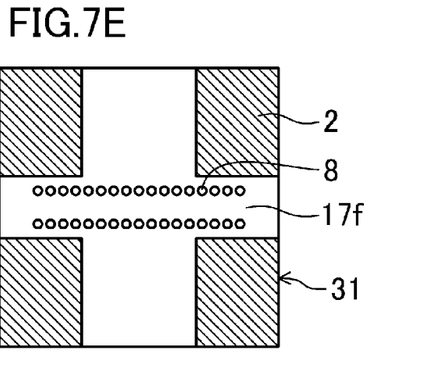

On the other hand, in this variation, as shown in FIG. 7E, the re-distribution structure 2 has an opening 17f in the region for disposing the conductive members 8. The opening 17f reaches four sides of the outer periphery of the expanded semiconductor chip 31. FIG. 7E is a top view schematically illustrating the opening of the re-distribution structure 2 according to this variation. In FIG. 7E, the same reference characters as those of the semiconductor device shown in FIGS. 1 and 2 are used to represent equivalent elements.

In addition to the advantages similar to those of the above-described embodiment, the above-described variation provides the following advantages. Specifically, for example, if the underfill material (i.e., the material of the underfill 9 of FIG. 1) is injected from at least one of the four sides of the expanded semiconductor chip 31 reached by the opening 17f of the re-distribution structure 2, the underfill material can be selectively discharged from the four sides. There is thus no need to address the leakage of the underfill material in the region of the expanded semiconductor chip 31 without the opening 17f. In other words, the filling characteristics of the underfill 9 improve, thereby manufacturing the semiconductor device at low costs.

In this variation, the underfill material is discharged from the four sides of the expanded semiconductor chip 31 reached by the opening 17d of the re-distribution structure 2. This further reduces the leakage of the underfill material in the region of the expanded semiconductor chip 31 without the opening 17f as compared to the above-described second to fourth variations.

Sixth Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the opening 17a of the re-distribution structure 2 is provided in the region for disposing the conductive members 8 as shown in FIG. 3.

Figure 8A:
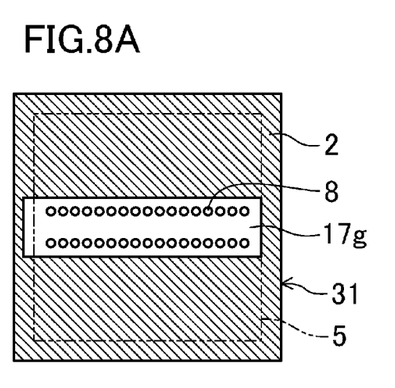
FIGS. 8A-8D are top views schematically illustrating the opening of the re-distribution structure 2 of the semiconductor device according to variations.

On the other hand, in this variation, as shown in FIG. 8A, the re-distribution structure 2 has an opening 17g in the region for disposing the conductive members 8. The opening 17g reaches an outside of one side of the outer periphery of the chip 5. FIG. 8A is a top view schematically illustrating the opening of the re-distribution structure 2 according to this variation. In FIG. 8A, the same reference characters as those of the semiconductor device shown in FIGS. 1 and 2 are used to represent equivalent elements.

In addition to the advantages similar to those of the above-described embodiment, the above-described variation provides the following advantages. Specifically, for example, in the injection of the underfill material (i.e., the material of the underfill 9 of FIG. 1), leakage of the underfill material is retained in the opening 17g. This reduces the distance from the region for disposing the conductive members 8 to the connection terminals 21 (not shown) above the expanded semiconductor chip 31 (specifically, the expanded portion 1). As such, the area of the expanded semiconductor chip 31 decreases, thereby manufacturing the semiconductor device at low costs.

In this variation, the leakage of the underfill material is retained in the opening 17g. This further reduces diffusion of the underfill material to the resin substrate 7 (see FIG. 1) as compared to the second to fifth variations.

Seventh Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the opening 17a of the re-distribution structure 2 is provided in the region for disposing the conductive members 8 as shown in FIG. 3.

Figure 8B:
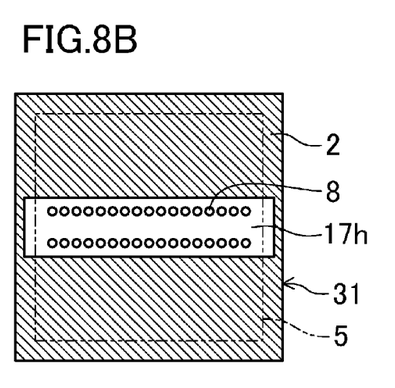

On the other hand, in this variation, as shown in FIG. 8B, the re-distribution structure 2 has an opening 17h in the region for disposing the conductive members 8. The opening 17h reaches outsides of two sides of the outer periphery of the chip 5. FIG. 8B is a top view schematically illustrating the opening of the re-distribution structure 2 according to this variation. In FIG. 8B, the same reference characters as those of the semiconductor device shown in FIGS. 1 and 2 are used to represent equivalent elements.

In addition to the advantages similar to those of the above-described embodiment, the above-described variation provides the following advantages. Specifically, for example, in the injection of the underfill material (i.e., the material of the underfill 9 of FIG. 1), leakage of the underfill material is retained in the opening 17h. This reduces the distance from the region for disposing the conductive members 8 to the connection terminals 21 (not shown) above the expanded semiconductor chip 31 (specifically, the expanded portion 1). As such, the area of the expanded semiconductor chip 31 decreases, thereby manufacturing the semiconductor device at low costs.

In this variation, the leakage of the underfill material is retained in the opening 17h. This further reduces diffusion of the underfill material to the resin substrate 7 (see FIG. 1) as compared to the second to fifth variations.

In this variation, the opening 17h is greater than the opening 17g of the sixth variation. This further reduces the diffusion of the underfill material to the resin substrate 7 as compared to the sixth variation.

Eighth Embodiment

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the opening 17a of the re-distribution structure 2 is provided in the region for disposing the conductive members 8 as shown in FIG. 3.

Figure 8C:
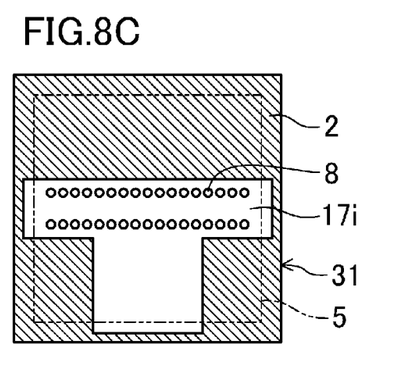

On the other hand, in this variation, as shown in FIG. 8C, the re-distribution structure 2 has an opening 17i in the region for disposing the conductive members 8. The opening 17i reaches outsides of three sides of the outer periphery of the chip 5. FIG. 8C is a top view schematically illustrating the opening of the re-distribution structure 2 according to this variation. In FIG. 8C, the same reference characters as those of the semiconductor device shown in FIGS. 1 and 2 are used to represent equivalent elements.

In addition to the advantages similar to those of the above-described embodiment, the above-described variation provides the following advantages. Specifically, for example, in the injection of the underfill material (i.e., the material of the underfill 9 of FIG. 1), leakage of the underfill material is retained in the opening 17i. This reduces the distance from the region for disposing the conductive members 8 to the connection terminals 21 (not shown) above the expanded semiconductor chip 31 (specifically, the expanded portion 1). As such, the area of the expanded semiconductor chip 31 decreases, thereby manufacturing the semiconductor device at low costs.

In this variation, the leakage of the underfill material is retained in the opening 17i. This further reduces diffusion of the underfill material to the resin substrate 7 (see FIG. 1) as compared to the second to fifth variations.

In this variation, the opening 17i is greater than the opening 17g of the sixth variation and the opening 17h of the seventh variation. This further reduces the diffusion of the underfill material to the resin substrate 7 as compared to the sixth and seventh variations.

Ninth Variation

In a semiconductor device according to this variation, the shape of the opening pattern of the re-distribution structure 2 is different from that of the semiconductor device according to the above-described embodiment shown in FIGS. 1-3.

Specifically, in the semiconductor device according to the above-described embodiment, the opening 17a of the re-distribution structure 2 is provided in the region for disposing the conductive members 8 as shown in FIG. 3.

Figure 8D:
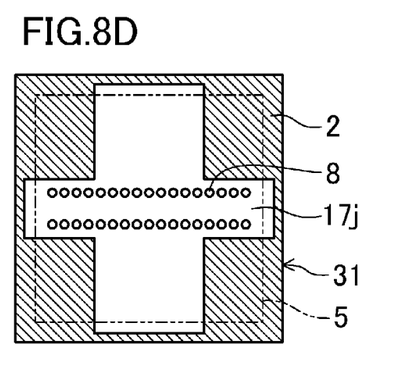

On the other hand, in this variation, as shown in FIG. 8D, the re-distribution structure 2 has an opening 17j in the region for disposing the conductive members 8. The opening 17j reaches outsides of four sides of the outer periphery of the chip 5. FIG. 8D is a top view schematically illustrating the opening of the re-distribution structure 2 according to this variation. In FIG. 8D, the same reference characters as those of the semiconductor device shown in FIGS. 1 and 2 are used to represent equivalent elements.

In addition to the advantages similar to those of the above-described embodiment, the above-described variation provides the following advantages. Specifically, for example, in the injection of the underfill material (i.e., the material of the underfill 9 of FIG. 1), leakage of the underfill material is retained in the opening 17j. This reduces the distance from the region for disposing the conductive members 8 to the connection terminals 21 (not shown) above the expanded semiconductor chip 31 (specifically, the expanded portion 1). As such, the area of the expanded semiconductor chip 31 decreases, thereby manufacturing the semiconductor device at low costs.

In this variation, the leakage of the underfill material is retained in the opening 17j. This further reduces diffusion of the underfill material to the resin substrate 7 (see FIG. 1) as compared to the second to fifth variations.

In this variation, the opening 17j is greater than the opening 17g of the sixth variation, the opening 17h of the seventh variation, and the opening 17i of the eighth variation. This further reduces the diffusion of the underfill material to the resin substrate 7 as compared to the sixth, seventh, eighth variations.

As described above, according to the present disclosure, in the semiconductor package having the CoC structure, the expanded portion is provided around the outer edge of the lower chip (i.e., the first semiconductor chip) to form the expanded semiconductor chip. Even if the lower chip is smaller than the upper chip (second semiconductor chip), the expanded semiconductor chip can be greater than the upper chip. Thus, for example, the conductive members can be drawn from the connection terminals provided in the expanded portion of the expanded semiconductor chip for the electrical connection with the resin substrate without using a particular semiconductor process, i.e., by simple connection such as wire bonding. Therefore, the plurality of semiconductor chips can be stacked to form the semiconductor package having the CoC structure without being influenced by constraints of the magnitude relation between the sizes of the stacked chips 5 and 6.

According to the present disclosure, in the semiconductor package having the CoC structure, the re-distribution structure is provided on the expanded portion and on the lower chip outside the region for disposing the conductive members (the CoC connecting portions), which electrically connect the upper chip to the lower chip. Thus, the upper and lower chips can be electrically connected together without interposing the re-distribution structure. Even if the pitch of the CoC connecting portions is reduced, there is no need to miniaturize the re-distribution structure accordingly. Thus, the plurality of semiconductor chips are stacked to form the semiconductor package having the CoC structure without being influenced by constraints of the rule of the re-distribution process.

Figure 9:
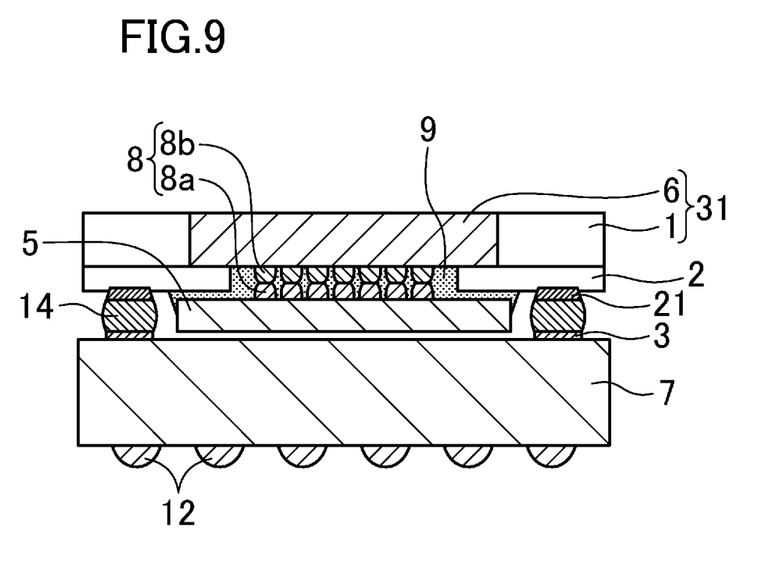
FIG. 9 is a cross-sectional view illustrating the semiconductor device according to a variation.

While the embodiment and the variations according to the present disclosure have been described above, the present disclosure is not limited to the above-described structures, and various modifications can be made within the spirit and scope of the invention. For example, the present disclosure includes electrical connection of the expanded semiconductor chip 31 to the resin substrate 7 via through-electrodes (not shown) provided in the expanded portion 1, or flip chip bonding of the expanded semiconductor chip 31 to the resin substrate 7 via bumps 14 shown in FIG. 9.

The semiconductor device according to the present disclosure is obtained by freely combining and stacking semiconductor chips without depending on the sizes of the semiconductor chips and the degree of the fineness of the process. The re-distribution line of the lower chip is formed without using any fine process, thereby significantly reducing the costs. Therefore, the semiconductor device according to the present disclosure is suitable as a CoC-type SiP.

What is claimed is:

1. A semiconductor device comprising:
   a base including first electrodes;
   a first semiconductor chip located on a surface of the base provided with the first electrodes, and including second electrodes;
   an expanded portion expanding outward from an outer edge of the first semiconductor chip, and forming an expanded semiconductor chip together with the first semiconductor chip;
   a second semiconductor chip including third electrodes, and located on the expanded semiconductor chip such that a surface of the second semiconductor chip provided with the third electrodes faces a surface of the first semiconductor chip provided wide the second electrodes;
   first conductive members connecting some of the second electrodes to the third electrodes;
   a re-distribution structure formed from a top of the first semiconductor chip outside a region for disposing the first conductive members along a top of the expanded portion;
   connection terminals provided above the expanded portion, and connected to ones of the second electrodes, which are connected to none of the first conductive members, via the re-distribution structure; and
   second conductive members connecting the first electrodes to the connection terminals,
   wherein the connection terminals are in physical contact with none of conductive members connecting to the third electrodes.

2. The semiconductor device of claim 1, wherein
   the re-distribution structure is located to avoid at least the region for disposing the first conductive members, thereby forming an opening in the re-distribution structure in the region for disposing the first conductive members.

3. The semiconductor device of claim 2, wherein
   a center of the opening of the re-distribution structure is not identical with a center of the region for disposing the first conductive members.

4. The semiconductor device of claim 2, wherein
   the opening of the re-distribution structure reaches one side of an) er periphery of the expanded semiconductor chip.

5. The semiconductor device of claim 2, wherein
   the opening of the re-distribution structure reaches two sides of an outer periphery of the expanded semiconductor chip.

6. The semiconductor device of claim 2, wherein
   the opening of the re-distribution structure reaches three sides of an outer periphery of the expanded semiconductor chip.

7. The semiconductor device of claim 2, wherein
   the opening of the re-distribution structure reaches four sides of an outer periphery of the expanded semiconductor chip.

8. The semiconductor device of claim 2, wherein
   the opening of the re-distribution structure reaches an outside of one side of an outer periphery of the second semiconductor chip.

9. The semiconductor device of claim 2, wherein
   the opening of the re-distribution structure reaches outsides of two sides of an outer periphery of the second semiconductor chip.

10. The semiconductor device of claim 2, wherein
    the opening of the re-distribution structure reaches outsides of three sides of an outer periphery of the second semiconductor chip.

11. The semiconductor device of claim 2, wherein
    the opening of the re-distribution structure reaches outsides of four sides of an outer periphery of the second semiconductor chip.

12. The semiconductor device of claim 1, wherein
    the first conductive members are bumps.

13. The semiconductor device of claim 1, wherein
    the connection terminals are wire bonding terminals, and the second conductive members are wires.

14. The semiconductor device of claim 1, wherein
    the re-distribution structure includes
    re-distribution lines connecting the second electrodes to the connection terminals, and
    an interlayer film covering the re-distribution lines.

15. The semiconductor device of claim 14, wherein
    the interlayer film is made of a resin material covering the expanded semiconductor chip.

16. The semiconductor device of claim 15, wherein
    the resin material is a photosensitive resin material, and
    resolution of the photosensitive resin material is lower than resolution of other photosensitive resin materials used for the second semiconductor chip.

17. The semiconductor device of claim 14, wherein
    at least an upper portion of the interlayer film is made of solder resist.

18. The semiconductor device of claim 1, wherein
    the re-distribution structure includes re-distribution lines, and
    a width and a pitch of the re-distribution lines are greater than those of other lines formed in the second semiconductor chip.

19. The semiconductor device of claim 1, wherein
    a planar shape of the second semiconductor chip is larger than a planar shape of the first semiconductor chip, and
    a planar shape of the expanded semiconductor chip is larger than the planar shape of the second semiconductor chip.

20. A semiconductor device comprising:
    a first semiconductor chip including first electrodes;
    an expanded portion expanding outward from an outer edge of the first semiconductor chip, and forming an expanded semiconductor chip together with the first semiconductor chip;
    a second semiconductor chip including second electrodes, and located on the expanded semiconductor chip such that a surface of the second semiconductor chip provided with the second electrodes faces a surface of the first semiconductor chip provided with the first electrodes;
    conductive members connecting some of the first electrodes to the second electrodes;
    a re-distribution structure formed from a top of the first semiconductor chip outside a region for disposing the conductive members along a top of the expanded portion; and
    connection terminals provided above the expanded portion, and connected to ones of the first electrodes, which are connected to none of the conductive members, via the re-distribution structure,
    wherein the connection terminals are in physical contact with none of conductive members connecting to the second electrodes on the second semiconductor chip.

* * * * *